US009711671B2

(12) United States Patent
Yang et al.

(10) Patent No.: US 9,711,671 B2
(45) Date of Patent: Jul. 18, 2017

(54) VIA STRUCTURES FOR SOLAR CELL INTERCONNECTION IN SOLAR MODULE

(71) Applicant: ALTA DEVICES, Inc., Santa Clara, CA (US)

(72) Inventors: Linlin Yang, Sunnyvale, CA (US); Gang He, Sunnyvale, CA (US); Dan Patterson, Sunnyvale, CA (US); Paul Goddu, Morgan Hill, CA (US); Liguang Lan, Sunnyvale, CA (US); Gregg Higashi, San Jose, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 0 days.

(21) Appl. No.: 14/858,808

(22) Filed: Sep. 18, 2015

(65) Prior Publication Data
US 2017/0084766 A1  Mar. 23, 2017

(51) Int. Cl.
*H01L 31/00* (2006.01)
*H01L 31/05* (2014.01)

(52) U.S. Cl.
CPC ......... *H01L 31/0508* (2013.01); *H01L 31/05* (2013.01)

(58) Field of Classification Search
CPC ............. H01L 31/0465; H01L 31/0504; H01L 31/0508; H01L 31/048; H01L 31/043; Y02E 10/50
USPC ................................ 136/244, 251, 256, 259
See application file for complete search history.

(56) References Cited

U.S. PATENT DOCUMENTS

| | | | | |
|---|---|---|---|---|
| 4,617,421 A | * | 10/1986 | Nath | ................. H01L 31/03921 136/244 |
| 4,965,655 A | * | 10/1990 | Grimmer | ........ H01L 31/022466 136/244 |
| 7,276,724 B2 | * | 10/2007 | Sheats | ................. H01L 31/0392 257/21 |
| 2005/0263178 A1 | * | 12/2005 | Montello | ............. H01G 9/2027 136/244 |

(Continued)

FOREIGN PATENT DOCUMENTS

| | | |
|---|---|---|
| EP | 2551919 A2 | 1/2013 |
| WO | WO 2014/065016 A1 | 5/2014 |

OTHER PUBLICATIONS

International Search Report and Written Opinion issued in International Patent Application No. PCT/US2016/052127 dated Dec. 12, 2016 (11 pages).

*Primary Examiner* — Thanh-Truc Trinh
(74) *Attorney, Agent, or Firm* — Arent Fox LLP

(57) ABSTRACT

System and method of providing a photovoltaic (PV) cell with a complex via structure in the substrate that has a primary via for containing a conductive material and an overflow capture region for capturing an overflow of the conductive material from the primary via. The conductive filling in the primary via may serve as an electrical contact between the PV cell and another PV cell. The overflow capture region includes one or more recesses formed on the substrate back surface. When the conductive material overflows from the primary via, the one or more recesses can capture and confine the overflow within the boundary of the complex via structure. A recess may be a rectangular or circular trench proximate to or overlaying the primary via. The recesses may also be depressions formed by roughening the substrate back surface.

20 Claims, 8 Drawing Sheets

(56) References Cited

U.S. PATENT DOCUMENTS

2006/0180195 A1\* 8/2006 Luch ................... H01L 31/0392
136/244
2011/0146782 A1\* 6/2011 Gabor ................... H01L 21/228
136/256

\* cited by examiner

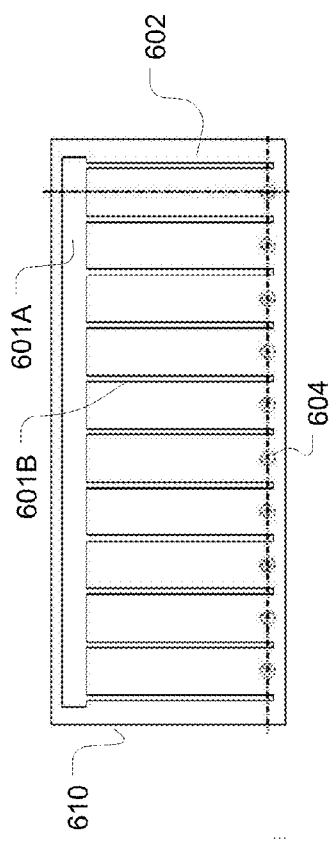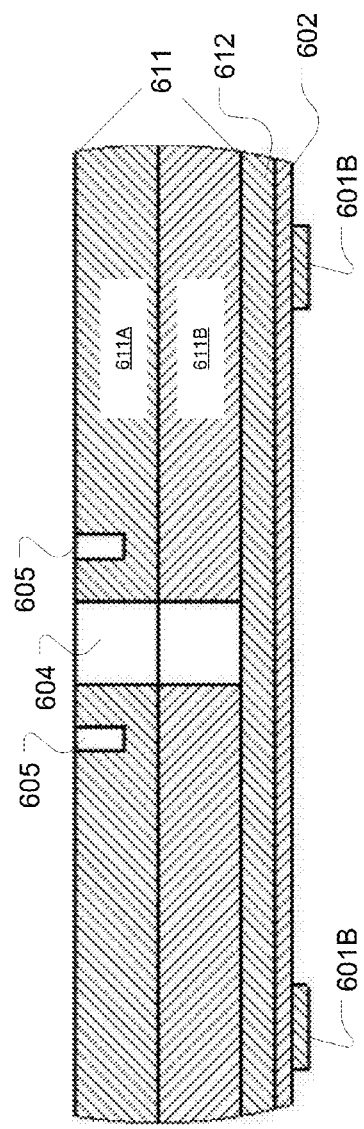

VIA STRUCTURES FOR SOLAR CELL INTERCONNECTION IN SOLAR MODULE

TECHNICAL FIELD

The present disclosure relates generally to the field of photovoltaic cells and, more specifically, to the field of contact metallization on photovoltaic cells.

BACKGROUND

A solar cell or photovoltaic (PV) cell is an electrical device that converts the energy of light directly into electricity by photovoltaic effect. Energy generated from solar cells offers renewable, environmentally friendly and readily available alternatives to fossil fuels. Typically a solar cell utilizes a PV layer made of semiconductor materials in the form of a p-n junction for energy conversion. Metal electrodes are laid on the front and the back of the semiconductor materials to conduct the produced voltage and current to external circuitry for power storage or transportation.

An array of solar cells can be interconnected and assembled into a solar module or a solar panel to achieve aggregated current and voltage generated by the individual solar cells. One prevalent approach of interconnecting solar cells is to overlap two solar cells to realize electrical connection, e.g., an upper cell and a lower cell. In a typical solar cell configuration, the back electrode of an upper cell is electrically connected with the front electrode of a lower cell. In this manner, multiple solar cells are interconnected in series.

More specifically, metal contacts disposed on the front and the back sides of a PV layer of a solar cell form the front electrode and the back electrode, respectively. The back electrode is disposed between the PV layer and a non-conductive substrate layer. Thus, when two cells partially overlap each other, the non-conductive substrate is disposed between the back electrode of the upper cell and the front electrode of the lower cell. To provide electrical continuity between the two overlapping cells, vias are made on the substrate and filled with a conductive material, which is commonly in the form of resin, paste or ink during the filling process and hardens after a cure process. Hereinafter, the vias on the substrate may be referred to as "back vias."

In practice, a back via is usually subject to overfill with the conductive material to prevent the formation of a void inside the via which can potentially lead to a failed contact. However, filling a back via with excess conductive material tends to cause an uncontrolled lateral overflow (or smear) of the conductive material from the via, especially when the two solar cells are stacked and pressed together for integration. Unfortunately, many contributing factors make it difficult to determine a precise amount of the conductive material for a void-free via without resulting in overflow, such as the variations in the volume control capability of material placement, via size variations, and material property changes over time, temperature, moisture, contact surface, and etc. For example, for a reasonably repeatable automatic dispense or printing process, the dispensed volume normally varies by 5%. With material property changes over time, the volume variation can increase to 10%. The via sizes can also vary with the laser drilling process and substrate material properties.

The conductive material overflow in a solar cell can undesirably reach and bridge the front and back electrodes of another solar cell (e.g., the lower solar cell) and cause short circuit. Conventionally, to solve this issue, an insulating material is deposited around the perimeter of the solar cells followed by a cure procedure. Unfortunately, this contributes to significantly increased manufacturing cost and time.

SUMMARY OF THE INVENTION

Therefore, it would be advantageous to provide a cell interconnection mechanism offering void-free electrical contacts through back via fillings and yet without causing short circuit.

Embodiments of the present disclosure employ a complex via structure in a solar cell substrate that has a primary via for containing a conductive material and an overflow capture region for capturing an overflow of the conductive material from the primary via. In some embodiments, the filling in the primary via serves as an electrical contact between a back electrode of the solar cell (the upper cell) and a front electrode of anther solar cell (the lower cell), thereby forming electrical interconnection between the cells. The overflow capture region includes one or more recesses formed on the substrate back surface. When the conductive material overflows from the primary via, e.g., in the process of stacking and pressing the cells together for integration, the one or more recesses can capture and confine the overflow within the boundary of the complex via structure. The recess may be a rectangular or circular trench proximate to or overlaying the primary via. The recesses may also be depressions formed by roughening the substrate back surface.

The overflow capture region around a via allows an overfill of the conductive material, which beneficially ensures a void-free via, and advantageously controls the overflow of the filling to a deterministic region. As the excessive filling would not spread to unintended areas, the potential short circuit issue related to the overflow is advantageously eliminated. Thus, it is no longer needed to form additional insulation between the front and the back electrodes in a solar cell to prevent short circuit as would be performed in the conventional approach. As a result, the solar cell productivity and reliability can be increased, and the manufacturing time and cost are saved.

According to one embodiment, a photovoltaic cell in a photovoltaic assembly includes: a photovoltaic layer configured to convert light energy to electrical energy; a front conducive layer disposed on a front side of the photovoltaic layer; a back conductive layer disposed on a back side of the photovoltaic layer; and a substrate. The front conductive layer and the back conductive layer are configured to conduct electrical current originated from the photovoltaic layer to external circuitry. The substrate layer is disposed under the photovoltaic layer. The substrate layer has a via structure that includes: a primary via filled with a conductive material forming an electrical contact with the back conductive layer; and an overflow capture region proximate to the primary via and configured to capture an overflow of the conductive material from the primary via.

The foregoing is a summary and thus contains, by necessity, simplifications, generalization and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

Embodiments of the present invention will be better understood from a reading of the following detailed description, taken in conjunction with the accompanying drawing figures in which like reference characters designate like elements and in which:

FIG. 6A illustrates the front view of an exemplary solar cell with complex via structures for providing electrical continuity between overlapping solar cells in accordance with an embodiment of the present disclosure;

FIG. 6B illustrates the crosssection of the exemplary solar cell in FIG. 6A along the diameter of a complex via structure.

DETAILED DESCRIPTION

Figure 1:
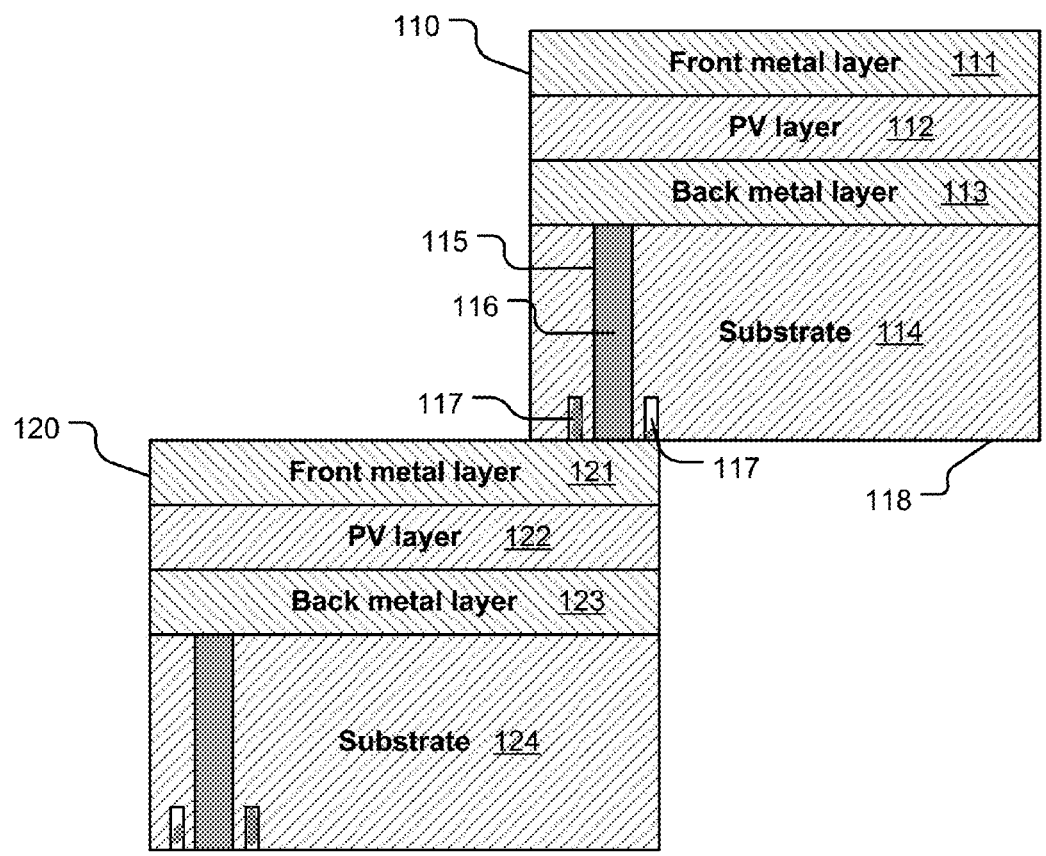
FIG. 1 is a crosssection view illustrating the integration configuration of two exemplary solar cells electrically coupled to each other through a complex via structure in accordance with an embodiment of the present disclosure.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. Although a method may be depicted as a sequence of numbered steps for clarity, the numbering does not necessarily dictate the order of the steps. It should be understood that some of the steps may be skipped, performed in parallel, or performed without the requirement of maintaining a strict order of sequence. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

NOTATION AND NOMENCLATURE

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Via Structures for Solar Cell Interconnection in Solar Module

Overall, embodiments of the present disclosure provide solar cells using a complex via structure in the substrate to provide an electrical contact between solar cells. The complex via structure includes a via for containing a conductive material to provide electrical continuity between the back electrode of an upper solar cell and the front electrode of a lower solar cell. The complex via structure includes additional recesses proximate to or overlaying the via that serve to capture and confine an overflow of the conductive material from the via to a deterministic region.

Herein, the terms "solar module," and "photovoltaic (PV) module" are used interchangeably; the terms "solar cell" and "PV cell" are used interchangeably. Herein, the terms "front" "back" "top" and "under" are used with reference to the intended orientation of a PV cell when it is installed in position for energy conversion. For example, the front side of the PV cell is intended to face sunlight.

The present disclosure is not limited to any specific configuration, structure, dimension, geometry, material composition, fabrication process or application of a solar cell. In some embodiments, the PV layer of the solar cell may include one or more thin film sub-layers based on GaAs, Copper Indium Gallium Selenide (CIGS), Cadmium Telluride (CdTe), amorphous Silicon, amorphous microcrystalline Tandem, thin-film polycrystalline Silicon, or etc. The substrate of the solar cell may be flexible or rigid and made of polymer, Silicon, glass, or etc. For example, the substrate is flexible and includes the a pressure sensitive adhesive (PSA) layer and a polyethylene terephthalate (PET) layer.

In some embodiments, an array of PV cells are electrically coupled in series to achieve higher power generation, where a front electrode of a respective PV cell is connected with a back electrode of another PV cell for example. FIG. 1 is a crosssection view illustrating the integration configuration of two exemplary solar cells 110 and 120 electrically coupled to each other through a complex via structure 115 in accordance with an embodiment of the present disclosure. In a basic form, each solar cell 110 or 120 includes a front metal layer 111 or 121, a PV layer 112 or 122, a back metal layer 113 or 123 and a nonconductive substrate 114 or 124. The two solar cells 110 and 120 are stacked together and overlap partially.

According to the present disclosure, the complex via structure 115 on the substrate 114 includes two parts, a via 116 and a circular recess 117. The via 116 is filled with a conductive material which provides electrical connection between the back metal layer 113 of the upper cell 110 and the front metal layer 121 of the lower cell 120, thereby interconnecting the upper cell 110 and the lower cell 120 in series.

Typically the conductive material is dispensed into the via 116 from the back surface 118 of the substrate 114 after the back metal layer 113 has been integrated with the substrate 114. As noted above, to ensure a void-free electrical contact through the via, it is practical to dispense an excessive amount of the conductive material into the via 116. Thereafter, the two cells 110 and 120 are stacked together tightly, which can cause the conductive material to overflow laterally along the back surface 118 of the substrate 114. According to the conventional approach, the overflow of the conductive material is uncontrolled and may spread to reach both the front metal layer 121 and the back metal layer 123 of the lower cell 120, resulting in short circuit of the lower cell 120.

According to the present disclosure, a recess 117 is formed proximate to the via 116 and configured to capture the overflow of the conductive material (shown by the shaded portions inside the recess 117). Thereby, the recess 117 controls the overflow of the filling to a deterministic region nearby the via. As the excessive filling does not spread to unintended areas, the potential short circuit issue related to the overflow is advantageously eliminated. Thus, it is no longer necessary to form additional insulation between the front and the back electrodes in a solar cell to prevent the short circuit as would performed in the conventional approach. The solar cell productivity and reliability can be increased, and the manufacturing time and cost are saved.

It will be appreciated that each constituent layer of a PV cell as shown in FIG. 1 may have various suitable material compositions and may be fabricated or integrated in the PV cell in any suitable manner that is well known in the art. Also, the sequence of integrating the various constituent layers varies depending on the particular embodiment.

Figure 2A:
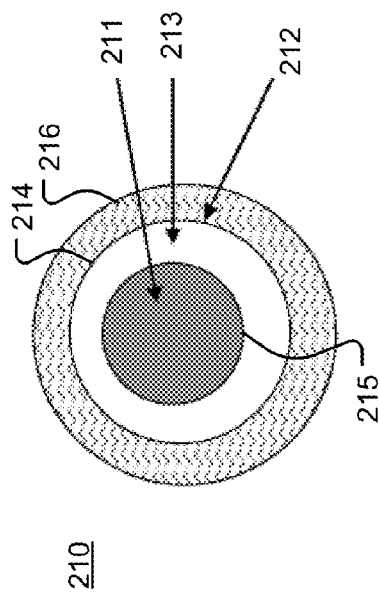
FIGS. 2A-2B illustrates the configuration of an exemplary complex via structure for providing electrical continuity between overlapping solar cells in accordance with an embodiment of the present disclosure.
Figure 2B:
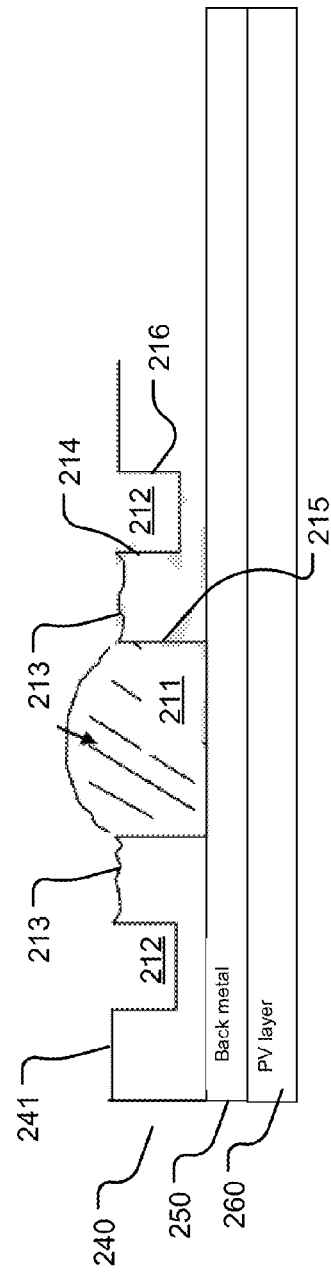

FIGS. 2A-2B illustrates the configuration of an exemplary complex via structure 210 for providing electrical continuity between overlapping solar cells in accordance with an embodiment of the present disclosure. FIG. 2A is a plane view from the back surface 241 of the substrate 240 that bears the complex via structure 210; and FIG. 2B is a crosssection view.

The complex via structure 210 includes the inner via 211 and a circular trench 212, both open at the substrate back surface 241. The inner edge 214 of the circular trench 212 is spaced apart from the edge 215 of the inner via 211 by a lateral distance (see the middle ring 213).

As shown in FIG. 2B, the back metal layer 250 is disposed between the substrate 240 and the PV layer 260. The inner via 211 is the intended reservoir for containing a conductive adhesive used to provide electrical contact and/or mechanical bonding between the illustrated cell and the cell placed underneath it (not explicitly shown). For instance, the conductive adhesive is in the form of ink, paste or resin and may be composed of Ag-epoxy. However, the present disclosure is not limited to any specific composition of the material dispensed in the via.

As noted above, the amount of the conductive adhesive dispensed in the via 211 typically exceeds the volume capacity of the via 211. When the present cell is integrated with another cell, the conductive adhesive disposed in the via is subject to an external pressure and tends to over flow laterally along the substrate back surface 241. The circular trench 212 is configured to collect and confine the smear-out adhesive within the border 216 of the trench 212.

It will be appreciated that the sizes and aspect ratios of the vias and the trench are determined based on the configuration of the solar cell as well as the interconnect process needs. For instance, the substrate has a thickness of about 100 μm; the diameter of the inner via 212 is in the range of 300~400 μm; the inner diameter of the trench 212 is in the range of 500~600 μm; the width of the trench 212 is in the range of 100~200 μm; and the depth of the trench 212 is in the range of 10~50 μm.

In some embodiments, the middle ring 213 is roughened to form microscopic depressions which can function as additional recesses for further restricting the excess adhesive within the region defined by the complex via structure 210. Moreover, the roughened surface with the conductive adhesive can increase the surface contact area with the conductive adhesive and therefore lead to strengthened mechanical bonding between the overlapping solar cells.

Figure 2C:
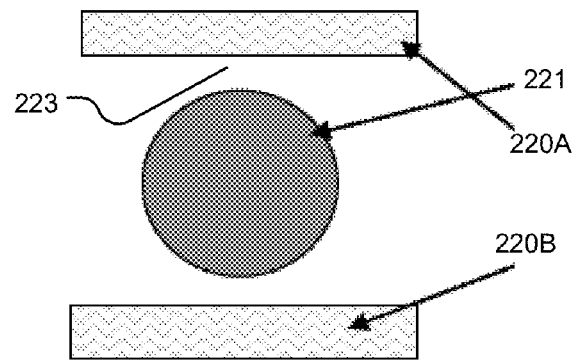
FIG. 2C illustrates the configuration of another exemplary complex via structure for providing electrical continuity between overlapping solar cells in accordance with an embodiment of the present disclosure.

The present disclosure is not limited by the geometric shape, dimension and number of trenches used for capturing an overflow of a material dispensed in a complex via structure. FIG. 2C illustrates the configuration of another exemplary complex via structure 220 for providing electrical continuity between overlapping solar cells in accordance with an embodiment of the present disclosure. FIG. 2C is a plane view from the back surface of the substrate (not explicitly shown) that bears the complex via structure 220. Instead of a circular trench 210 in FIG. 2A, the complex via structure 220 includes two linear trenches 222A and 222B proximate to the via 221 and configured for capturing the excess conductive adhesive overflowing from the via 221. The sizes, aspect ratios and orientation of the linear trenches 222A and 222B may vary in different embodiments depending on the configuration of the solar cell, the dispensing process, the cell integration process, and etc. Similar with 210, the bridging region 223 between the via 221 and the trenches 222A and 222B can be roughened to provide additional recesses for capturing the overflow of the conductive adhesive from the via 221.

Figure 2D:
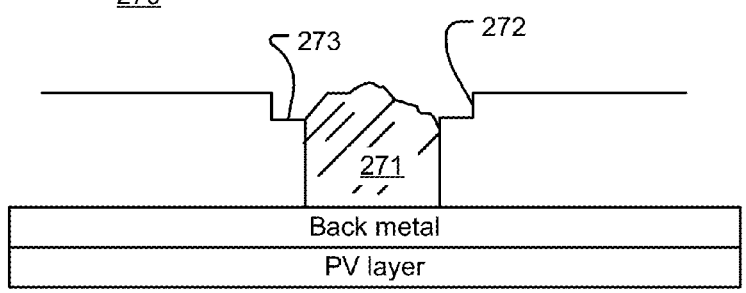
FIG. 2D illustrates the configuration of a third exemplary complex via structure for providing electrical continuity between overlapping solar cells in accordance with an embodiment of the present disclosure.

FIG. 2D illustrates the configuration of a third exemplary complex via structure 270 for providing electrical continuity between overlapping solar cells in accordance with an embodiment of the present disclosure. The complex via structure 270 includes a shallow circular trench 272 overlaying the via 271 to capture an overflow from the via 271. More specifically, the via 271 has one end open to the bottom of the trench 272. The bottom wall 273 of the trench can be roughened to increase surface area and so bonding strength with the captured conductive adhesive.

Figure 2E:
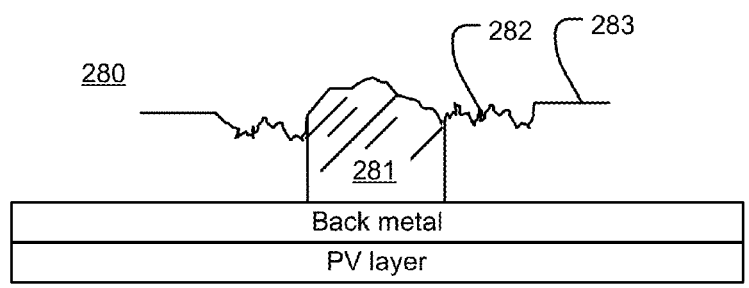
FIG. 2E illustrates the configuration of a fourth exemplary complex via structure for providing electrical continuity between overlapping solar cells in accordance with an embodiment of the present disclosure.

FIG. 2E illustrates the configuration of a fourth exemplary complex via structure 280 for providing electrical continuity between overlapping solar cells in accordance with an embodiment of the present disclosure. The complex via structure 280 includes a roughened zone 282 on the substrate back surface 283 surrounding the via 281. The microscopic recesses or pits in the roughened zone 282 are used to capture the overflow of the conductive adhesive from the via 281.

It will be appreciated a complex via structure according to the present disclosure may include various other recess configurations for capturing an overflow of a material dispensed in the via. For another example, the recesses may assume the form of a plurality of non-through vias, or depressions of any regular or irregular geometry.

Figure 3:
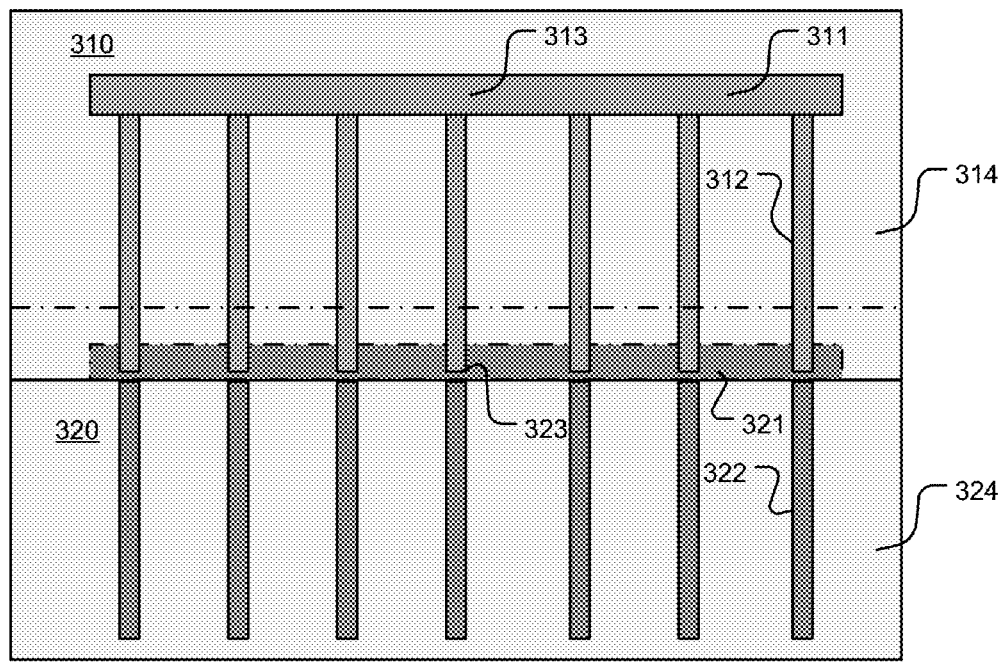
FIG. 3 illustrates a top view of an exemplary PV module with multiple PV cells electrically coupled in series through back via structures in accordance with an embodiment of the present disclosure.

FIG. 3 illustrates a top view of an exemplary PV module 300 with multiple PV cells electrically coupled in series through back via structures in accordance with an embodiment of the present disclosure. Each PV cell includes a front electrode and a back electrode disposed on opposite sides of the PV layer. The front electrode of each PV cell is configured in a comb shape and includes a number of discrete electrodes (or "finger electrodes") interspersed on the front surface of the PV cell and an extraction electrode (or "bus bar") connected to all the discrete electrodes for collecting the current therefrom. However, the present disclosure is not limited by the material composition, configuration and arrangement of the front electrodes or the back electrodes of each PV cells. For instance, the front electrode is made of a metal strip, e.g., composed primarily of Cu and about 50 μm thick. The PV layer includes a single layer or a stack of thin films, typically with a total thickness much less than the front metal layer 220, e.g., less than 10 μm.

The back electrode is disposed on top of the nonconductive flexible substrate which has a number of back vias filled with a conductive material, as described in greater detail with reference to FIGS. 1-2E. According to the present disclosure, one or more recesses (e.g., a trench, pits in a roughened zone) disposed proximate to a back via are used to capture and confine the overflow of the conductive material from the back via.

For instance, the substrate is made of multiple layers and is about 100 μm in thickness; while the total thickness of the PV cell is about 110 μm. The finger electrodes may be formed on the PV layer surface by plating or any other suitable technique that is well known in the art. In this example, the bus bar is oriented perpendicular to the finger electrodes.

The two PV cells 310 and 320 overlap partially such that the bus bar of the lower PV cell 320 are in direct contact with the conductive filling in the back vias of the upper PV cell 310. In this manner, the bus bar 321 of the lower PV cell 320 is electrically connected to the back electrode of the upper PV cell 310.

In one embodiment, each PV layer 314 or 324 includes one or more p-n junctions formed by doped GaAs-based thin films. For purposes of practicing the present disclosure, a PV layer may be formed on the substrate using various suitable thin film processes that is well known in the art, such as molecular beam epitaxy, metal-organic chemical vapor deposition, physical vapor deposition, etc.

Figure 4:
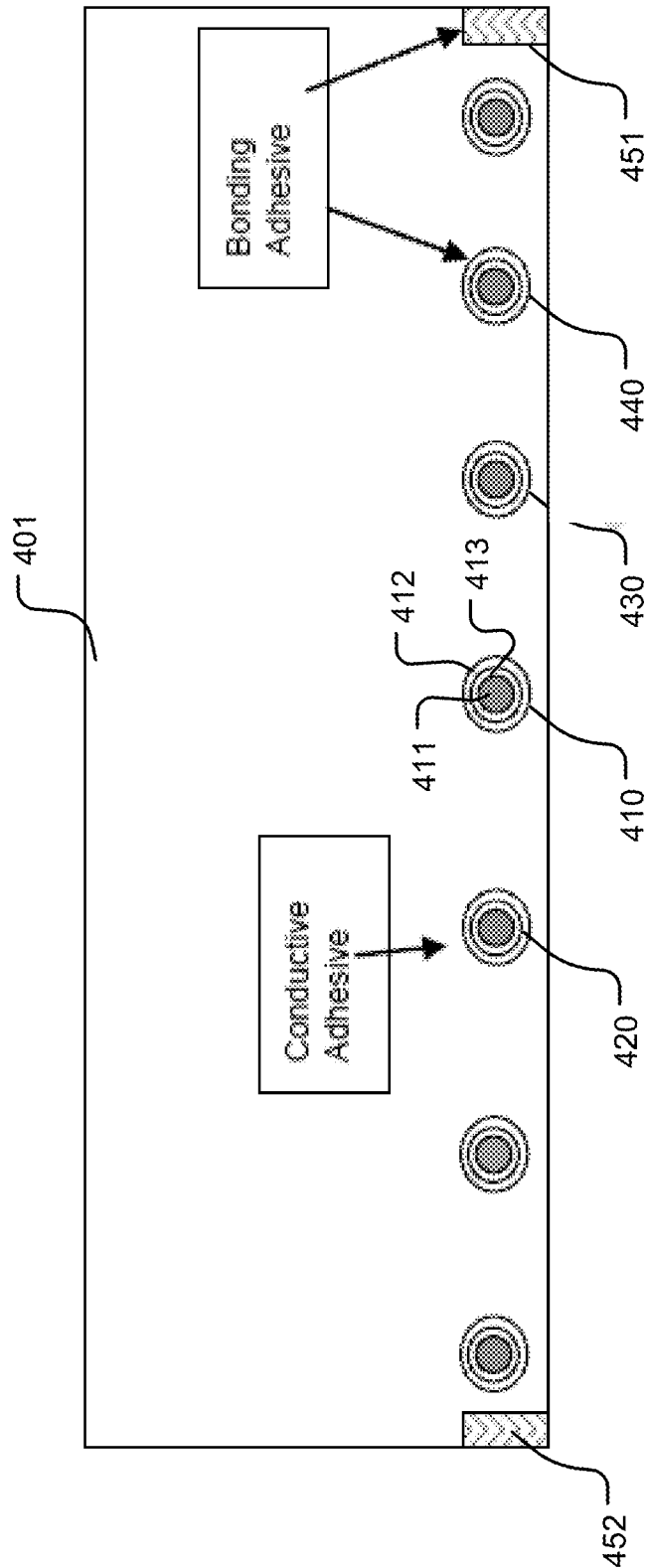
FIG. 4 illustrates the plane view from the back surface of a PV cell substrate that has a plurality of complex via structures in accordance with an embodiment of the present disclosure.

FIG. 4 illustrates the plane view from the back surface of a PV cell substrate 401 that has a plurality of complex via structures in accordance with an embodiment of the present disclosure. As shown in FIGS. 1 and 3, the back surface of the PV cell will partially overlap the front electrode of another PV cell for integration into a solar module.

Each complex via structure (e.g., 410) includes an inner via (e.g., 411), a circular trench (e.g. 412) and a bridging area in-between. In this example, some of the via structures (e.g., 420 and 430) are filled with a conductive material for providing inter-cell electrical contacts. The other back vias (e.g., 410 and 440) are filled with a bonding adhesive material, which may be nonconductive and mainly used for providing inter-cell mechanical bonding. In some embodiments, the back vias used for containing the bonding adhesive do not penetrate through the substrate layer 401.

The bonding adhesive is also dispensed at the corners 451 and 452 of the substrate back surface to enhance mechanical bonding strength between the two overlap cells. The corners 451 and 452 may be roughened before the bonding adhesive is applied thereto.

Figure 5:
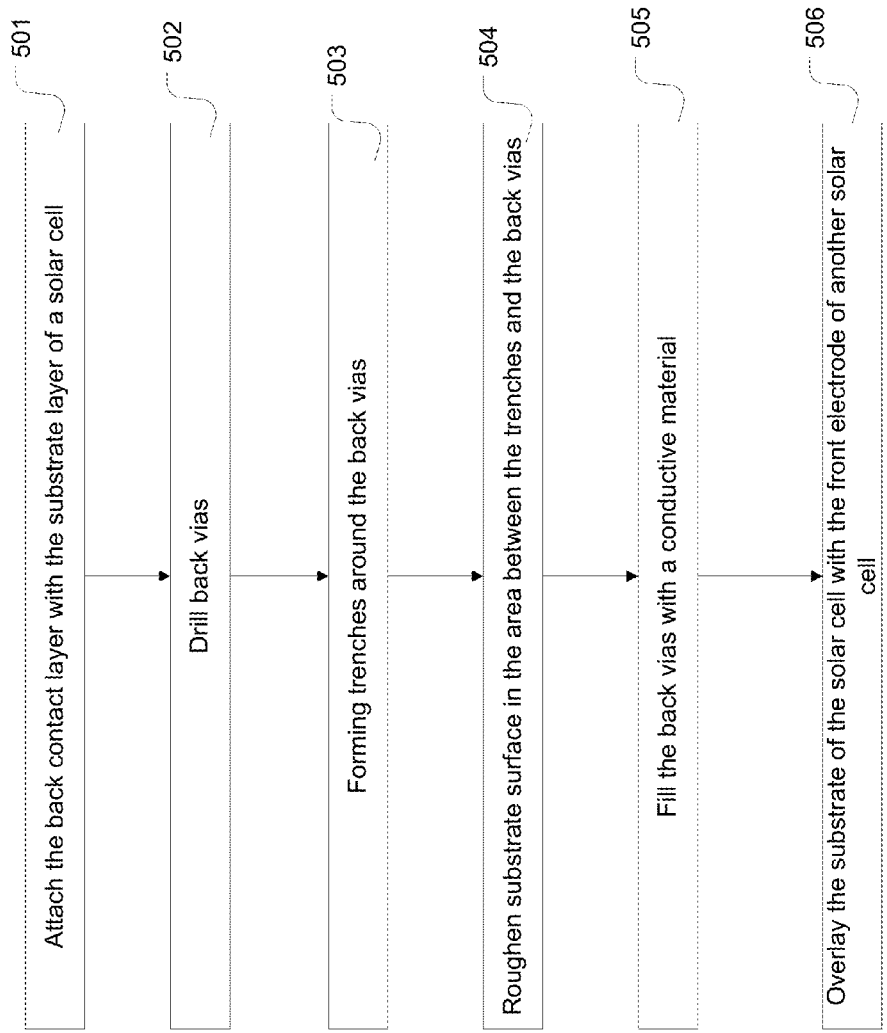
FIG. 5 is a flow chart depicting an exemplary process of integrating two PV cells in a solar module in accordance with an embodiment of the present disclosure.

FIG. 5 is a flow chart depicting an exemplary process 500 of integrating two PV cells in a solar module in accordance with an embodiment of the present disclosure. At 501, a back contact layer of a PV cell is attached with the substrate layer, e.g., through a lamination or other bonding process. At 502, the substrate layer is drilled through at selected locations to generate a plurality of through back vias by using a laser ablation process. However, the vias can be formed in any other suitable manner that is well known in the art, such as mechanical drilling, etching, and etc. A via formation process is selected according to the properties of the substrate layer and other relevant components of the PV cell. As noted above, additional non-through back vias may also be generated for containing a bonding material.

At 503, the overflow capture trenches are generated around each back via. At 504, the bridging area on the substrate back surface between a back via and the overflow capture trenches are roughened, e.g., using a laser ablation process to achieve the peak-to-peak roughness of 10 μm. In some embodiments, other selected areas on the substrate back surface are also roughened, such as the bottom of the overflow capture trench(es), the corners or edges of the substrate, and etc.

In some other embodiments, an overflow capture trench is formed by expanding one end of an back via, resulting in a trench overlaying the back via, as shown in FIG. 2E.

At 505, a conductive material is dispensed into the through back vias to generate electrical contacts with the back electrode of the PV cell, e.g., by injection, deposition, evaporation or any other suitable dispensing process. As described above, overfilling the conductive material in each back via may be needed to obtain a void-free electrical contact. In some embodiments, a bonding material is similarly dispensed into the non-through back vias.

At 506, the PV cell (the upper cell) with the filled back vias is stacked on top of another solar cell (the lower cell), with the back vias of the upper cell in direct contact with the front electrode of the lower cell. Thus, the conductive material electrically connects the back electrode of the upper cell and the front electrode of the lower cell.

FIG. 6A illustrates the front view of an exemplary solar cell 610 with complex via structures for providing electrical continuity between overlapping solar cells in accordance with an embodiment of the present disclosure. FIG. 6B illustrates the crosssection of the exemplary solar cell in FIG. 6A along the diameter of a complex via structure.

FIG. 6A shows the comb-shaped front electrode overlaying on the PV layer 602. The front electrode includes the finger electrodes 601B and the bus bar 601A. The back vias 604 are disposed in between finger electrodes in terms of lateral positions. Each back via is surrounded by a circular trench 605 for capturing an overflow of the filling material from the back via.

As shown in FIG. 6B, from back to front, the PV cell includes a substrate layer 611, a back metal layer 612, a PV layer 613, and a front metal layer 614 which corresponds to the finger electrodes in FIG. 6A. The substrate layer 611 includes the combination of a PSA layer 611B and a PET layer 611A. The back via 604 penetrates both sub-layers of the substrate. The circular trench 605 has a depth less than the thickness of the PSA layer 611B.

Figure 7:
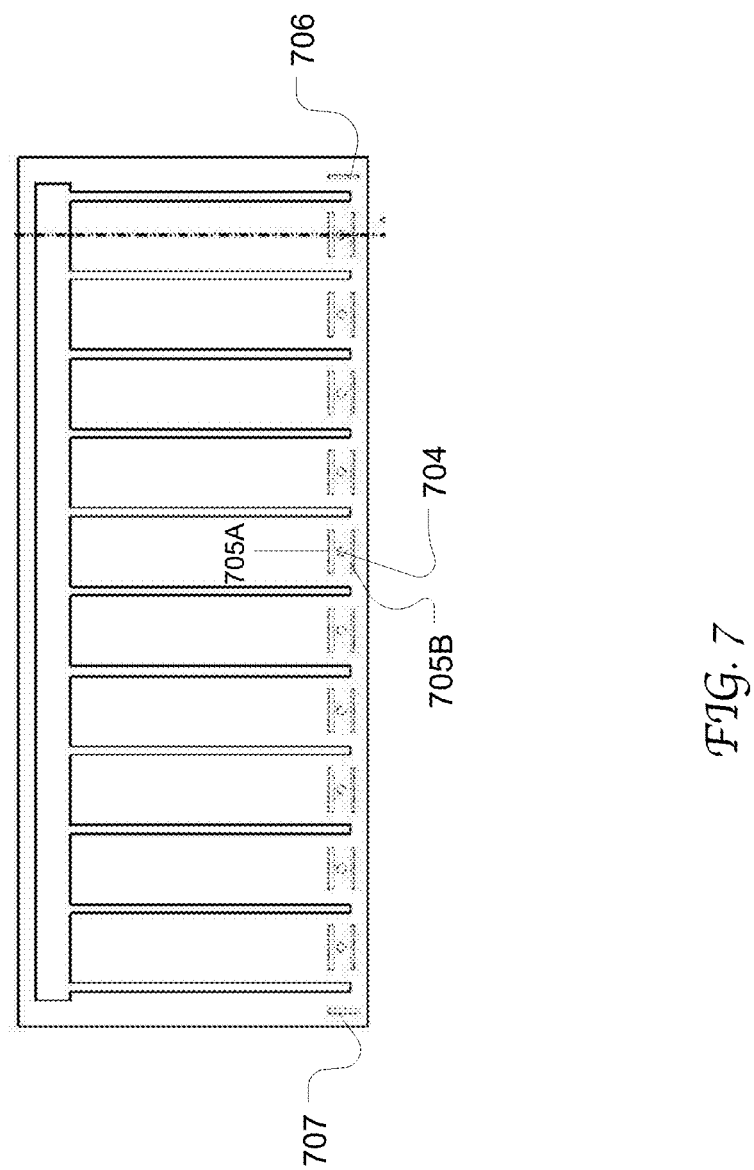
FIG. 7 illustrates the front view of another exemplary solar cell with complex via structures for providing electrical continuity between overlapping solar cells in accordance with an embodiment of the present disclosure.

FIG. 7 illustrates the front view of another exemplary solar cell 710 with complex via structures for providing electrical continuity between overlapping solar cells in accordance with an embodiment of the present disclosure. The solar cell 710 has substantially the same configuration as the solar cell 610 in FIG. 6. However, each back via (e.g., 704) is disposed between two linear trenches (705A and 705B) for capturing an overflow of the filling material from the back via. In this example, the linear trenches are orientated in parallel with the bus bar and have a length much greater than the diameter of the via 704. However the present disclosure is not limited to this configuration.

Two additional trenches 706 and 707 are disposed at the corners of the substrate for capturing overflows of the filling material from the back vias. The trenches 706 and 707 have a different orientation than the other trenches (e.g., 705A and 705B). Using different orientations of linear trenches facilitate to capture overflows of different directions.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A photovoltaic cell comprising:
    a photovoltaic layer configured to convert light energy to electrical energy;
    a front conductive layer disposed on a front side of the photovoltaic layer;
    a back conductive layer disposed on a back side of the photovoltaic layer, wherein said front conductive layer and said back conductive layer are configured to conduct electrical current originated from the photovoltaic layer to external circuitry; and
    a substrate layer disposed under said photovoltaic layer, wherein said substrate layer comprises a via structure comprising:
        a primary via filled with a conductive material forming an electrical contact with said back conductive layer; and
        an overflow capture region proximate to said primary via and configured to capture an overflow of said conductive material from said primary via.

2. The photovoltaic cell as described in claim 1, wherein said overflow capture region comprises a circular trench surrounding said primary via, and wherein a top of said trench opens at a back surface of said substrate layer.

3. The photovoltaic cell as described in claim 2, wherein, on said back surface of said substrate layer, an inner edge of said trench is disposed away from an edge of said primary via by a lateral distance.

4. The photovoltaic cell as described in claim 3, wherein said back surface of said substrate layer within said lateral distance comprises a roughened surface area.

5. The photovoltaic cell as described in claim 2, wherein a top of said primary via opens at a bottom wall of said trench.

6. The photovoltaic cell as described in claim 1, wherein said overflow capture region comprises a plurality of rectangular trenches and, and wherein a top of a respective trench opens at a back surface of said substrate layer.

7. The photovoltaic cell as described in claim 1, wherein said overflow capture region comprises a roughened surface area in a back surface of said substrate layer, wherein said roughened surface area has a peak-to-peak roughness greater than 10 μm.

8. The photovoltaic cell as described in claim 1, wherein said conductive material in said primary via provides electrical continuity between said back contact layer and a front contact layer of another photovoltaic cell.

9. The photovoltaic cell as described in claim 8, wherein said substrate layer further comprises another via structure filled with a nonconductive material forming bonding between said substrate layer and said another photovoltaic cell.

10. A method of manufacturing photovoltaic modules, said method comprising:
    attaching a back contact layer on a front surface of a substrate layer of a first photovoltaic cell;
    forming a via in said substrate layer;
    forming an overflow capture structure on a back surface of said substrate layer proximate to said via;
    dispensing a conductive material in said via;
    attaching said substrate layer with a second photovoltaic cell, wherein said overflow capture structure is configured to capture an overflow of said conductive material from said via.

11. The method as described in claim 10, wherein said attaching said substrate layer comprises placing said back surface of said substrate layer on a front contact layer of said second photovoltaic cell, and wherein said conductive material in said via provides an electrical contact between said first photovoltaic cell and said second photovoltaic cell.

12. The method as described in claim 10, wherein said forming said overflow capture structure comprises:
    forming a trench surrounding said via, wherein an inner edge of said trench is disposed away from an edge of said via by a lateral distance; and
    roughening said back surface of said substrate layer within said lateral distance.

13. The method as described in claim 12, wherein said forming said trench and said roughening are performed using laser ablation.

14. The method as described in claim 10, wherein said forming said overflow capture structure comprises expanding an opening of said via from said back surface of said substrate layer.

15. The method as described in claim 10, wherein said forming said overflow capture structure comprises roughening an area surrounding said via using laser ablation.

16. The method as described in claim 10, wherein said overflow occurs during said substrate layer being pressed against said second photovoltaic cell.

17. A photovoltaic module comprising:
    an array of photovoltaic cells electrically coupled to each other, wherein a respective photovoltaic cell comprises a photovoltaic device configured to convert light energy to electrical energy;

a front electrode disposed on a front surface of said photovoltaic device;

a back electrode disposed on a back surface of said photovoltaic device, wherein said front electrode and said back electrode are configured to conduct electrical current originated from said photovoltaic device to external circuitry;

a substrate disposed on a back surface of said back electrode, wherein said substrate comprises:

- a plurality of back vias filled with a conductive material for providing an electrical contact between said back electrode and a front electrode of another photovoltaic cell in said array of photovoltaic cells;
- a plurality of overflow capture regions on a back surface of said substrate and configured to prevent an overflow of said conductive material beyond edges of said back electrode, wherein a respective overflow capture region comprises a recess.

18. The photovoltaic module as described in claim 17, wherein said recess corresponds to a trench disposed proximate to a respective back via of said plurality of back vias, wherein said trench opens at said back surface of said substrate.

19. The photovoltaic module as described in claim 17, wherein said recess comprises a trench overlaying a respective back via of said plurality of back vias, wherein said trench opens at said back surface of said substrate, and wherein said via opens at a bottom of said trench.

20. The photovoltaic module as described in claim 17, wherein said recess comprises a roughened region with protrusions and depressions, wherein said roughened region has a peak-to-peak roughness greater than 10 μm.

* * * * *